(12) United States Patent
Yamashita

(10) Patent No.: US 12,701,763 B2
(45) Date of Patent: Aug. 4, 2026

(54) GRAPHENE OPTICAL SENSOR

(71) Applicant: Fujitsu Limited, Kawasaki (JP)

(72) Inventor: Hiroyasu Yamashita, Isehara (JP)

(73) Assignee: Fujitsu Limited, Kawasaki (JP)

( * ) Notice: Subject to any disclaimer, the term of this patent is extended or adjusted under 35 U.S.C. 154(b) by 828 days.

(21) Appl. No.: 17/901,225

(22) Filed: Sep. 1, 2022

(65) Prior Publication Data

US 2023/0178610 A1     Jun. 8, 2023

(30) Foreign Application Priority Data

Dec. 7, 2021     (JP) ................................. 2021-198337

(51) Int. Cl.
H10D 62/80     (2025.01)
G01N 21/65     (2006.01)
H10P 14/20     (2026.01)

(52) U.S. Cl.
CPC ......... H10D 62/882 (2025.01); G01N 21/658 (2013.01); H10P 14/3406 (2026.01)

(58) Field of Classification Search
CPC ......... H01L 21/02606; H01L 23/53276; H01L 21/02376; H01L 21/02527; Y10S 977/842–848; Y10S 977/742–752; Y10S 977/734–753; H10K 85/221–225; H10K 30/00; H10K 30/81; C01B 32/158–178; C01B 2202/00–36; C01B 32/182–198; C01B 2204/00–32; C01B 32/25–28; H01J 2329/0455; H01J 2201/30434; H01J 2201/30469; H10D 62/882;
(Continued)

(56) References Cited

U.S. PATENT DOCUMENTS

| | | | |
|---|---|---|---|
| 2014/0319357 A1 | 10/2014 | Ogawa et al. | |
| 2016/0223723 A1* | 8/2016 | Han | G02F 1/292 |

(Continued)

FOREIGN PATENT DOCUMENTS

| | | |
|---|---|---|
| JP | 2015-045629 A | 3/2015 |
| JP | 2019-036755 A | 3/2019 |

OTHER PUBLICATIONS

Yao, Y. et al., "High-Responsivity Mid-Infrared Graphene Detectors with Antenna-Enhanced Photocarrier Generation and Collection," Nano Letters 14, American Chemical Society, pp. 3749-3754 (Year: 2014).

*Primary Examiner* — Moin M Rahman
(74) *Attorney, Agent, or Firm* — ArentFox Schiff LLP

(57)     ABSTRACT

A graphene optical sensor includes a graphene layer having a surface, a first electrode and a second electrode, formed on the surface of the graphene layer, and arranged in a first direction parallel to the surface of the graphene layer, and a plurality of plasmonic antennas provided on the surface of the graphene layer between the first and second electrodes. Each plasmonic antenna of the plurality of plasmonic antennas, in a plan view, includes a first rod portion extending in a second direction inclined from the first direction, and a second rod portion extending in a third direction inclined from the first direction in a direction opposite the second direction with reference to the first direction, and intersecting the first rod portion. The plurality of the plasmonic antennas is arranged periodically in the second direction and in the third direction.

10 Claims, 8 Drawing Sheets

(58) Field of Classification Search
CPC ....... H10D 62/83–834; H10D 62/8303; G01N
21/658; G01N 21/553; G01N 21/554;
H10F 30/10; H10F 77/122; H10F 77/16;
H10F 77/413; B82Y 10/00; H10P
14/2903
See application file for complete search history.

(56) References Cited

U.S. PATENT DOCUMENTS

| | | | |
|---|---|---|---|
| 2016/0315206 A1* | 10/2016 | Lupaca-Schomber ...................... H10F 71/00 | |
| 2017/0153367 A1 | 6/2017 | Girard Desprolet et al. | |
| 2017/0301819 A1* | 10/2017 | Yao ......................... | H10F 99/00 |
| 2019/0173428 A1* | 6/2019 | Kiehl ..................... | H03B 15/00 |
| 2019/0278398 A1* | 9/2019 | Kim .................... | G06F 3/04164 |

\* cited by examiner

THIRD DIRECTION

FIRST DIRECTION

SECOND DIRECTION

THIRD
DIRECTION

SECOND
DIRECTION

THIRD DIRECTION

FIRST DIRECTION

SECOND DIRECTION

THIRD DIRECTION

FIRST DIRECTION

SECOND DIRECTION

THIRD DIRECTION

FIRST DIRECTION

SECOND DIRECTION

GRAPHENE OPTICAL SENSOR

CROSS-REFERENCE TO RELATED APPLICATIONS

This application is based upon and claims the benefit of priority of the prior Japanese Patent Application No. 2021-198337, filed on Dec. 7, 2021, the entire contents of which are incorporated herein by reference.

FIELD

The embodiments discussed herein are related to graphene optical sensors.

BACKGROUND

Substances emit thermal radiation light according to temperatures thereof. Wavelengths of thermal radiation light emitted from the substances at room temperature have a highest intensity in an infrared wavelength region. For this reason, infrared sensors that detect the thermal radiation are popularly used for night vision devices, thermography, or the like.

Recently, a method of infrared detection using graphene has been proposed. The graphene is a two-dimensional material in which carbon atoms are arranged in a two-dimensional honeycomb arrangement. Because the graphene has a distinctive energy band structure, the graphene can absorb light over a wide wavelength range from an ultraviolet region to a terahertz region.

A graphene-based photoconductor is an example of an optical sensor using the graphene. The photoconductor includes a graphene layer, and electrodes connected to both ends of the graphene layer. When light enters the graphene layer, the light is absorbed by the graphene layer, thereby generating electron-hole pairs. The electrons and holes that are generated are collected at the electrodes due to a voltage applied across the electrodes, to thereby form a photocurrent. By measuring a change in an amount of the photocurrent, it is possible to detect the light incident to the optical sensor.

However, the graphene has a light absorption efficiency that is typically on the order of a few percent and low compared to light absorption efficiencies of materials that are generally used for the optical sensors. In addition, recombination of the electron-hole pairs that are generated by the light absorption may occur, causing deactivation and no longer contributing to the photocurrent. In order to solve such problems, optical sensors having an antenna rod arranged on graphene have been proposed.

Examples of related art include Japanese Laid-Open Patent Publication No. 2015-045629, Japanese Laid-Open Patent Publication No. 2019-036755, U.S. Patent Application Publication 2017/0153367, and Y. Yao et al., "High-Responsivity Mid-Infrared Graphene Detectors with Antenna-Enhanced Photocarrier Generation and Collection", Nano Letters 14, pp. 3749-3754, 2014, for example.

The proposed optical sensors having the antenna rod arranged on the graphene have a polarization dependence. For this reason, in a case where an optical signal to be detected is polarized, the optical sensor needs to be arranged at an orientation that enables an efficient light detection. On the other hand, in a case where the optical signal to be detected is unpolarized, it is impossible to detect half or more of components of the optical signal.

SUMMARY

Accordingly, it is an object in one aspect of the embodiments to provide a graphene optical sensor capable of reducing a polarization dependence.

According to one aspect of the embodiments, a graphene optical sensor includes a graphene layer having a surface; a first electrode and a second electrode, formed on the surface of the graphene layer, and arranged in a first direction parallel to the surface of the graphene layer; and a plurality of plasmonic antennas provided on the surface of the graphene layer between the first and second electrodes, wherein each plasmonic antenna of the plurality of plasmonic antennas, in a plan view, includes a first rod portion extending in a second direction inclined from the first direction, and a second rod portion extending in a third direction inclined from the first direction in a direction opposite the second direction with reference to the first direction, and intersecting the first rod portion, and wherein the plurality of plasmonic antennas is arranged periodically in the second direction and in the third direction.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
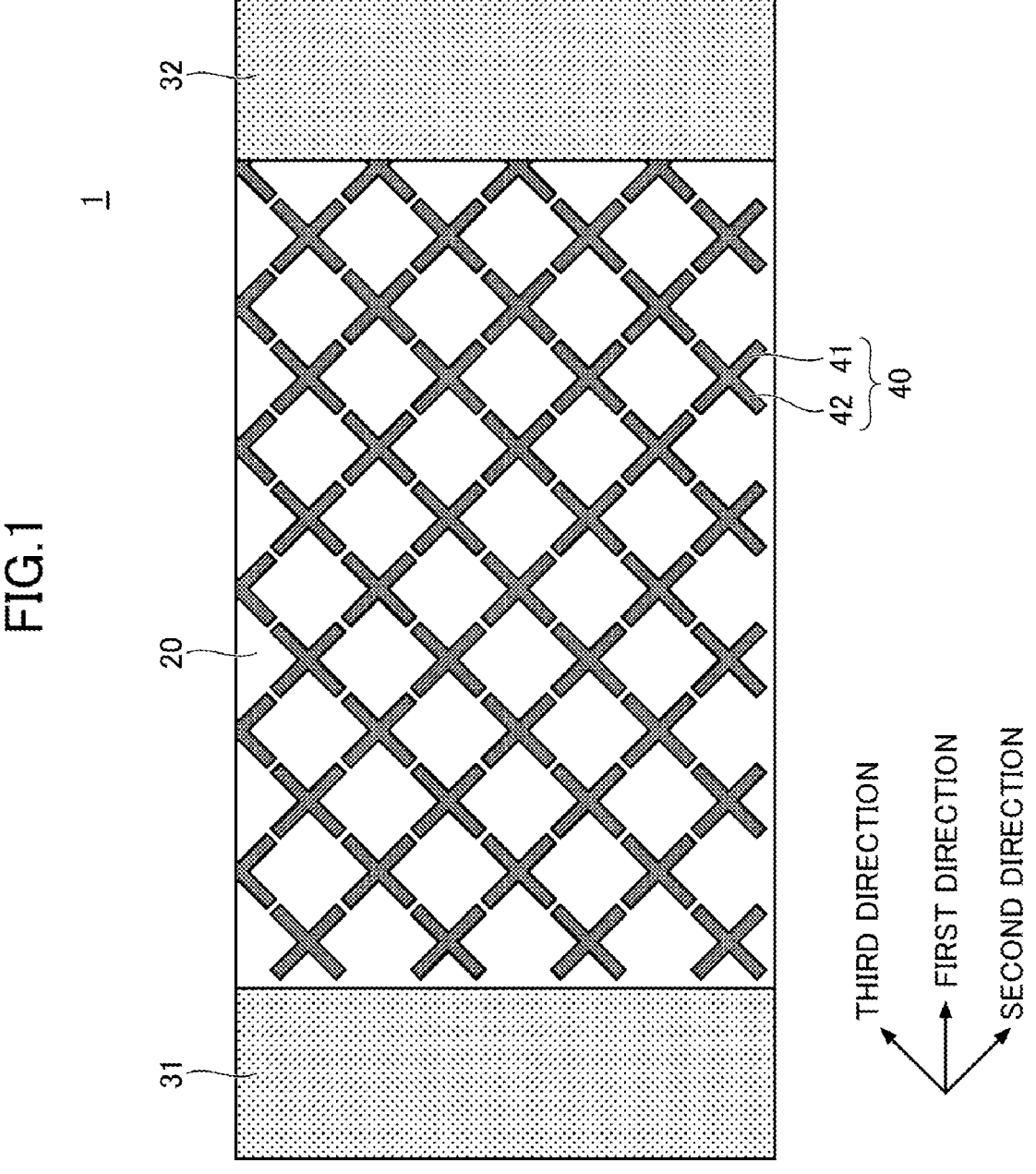
FIG. 1 is a plan view illustrating a graphene optical sensor according to an embodiment.

Preferred embodiments of the present invention will be described with reference to the accompanying drawings.

A description will now be given of a graphene optical sensor according to embodiments and modifications of the present invention. In the present specification and the drawings, constituent elements having substantially the same functions or configuration are designated by the same reference numerals, and a repeated description of substantially the same constituent elements may be omitted.

Figure 2:
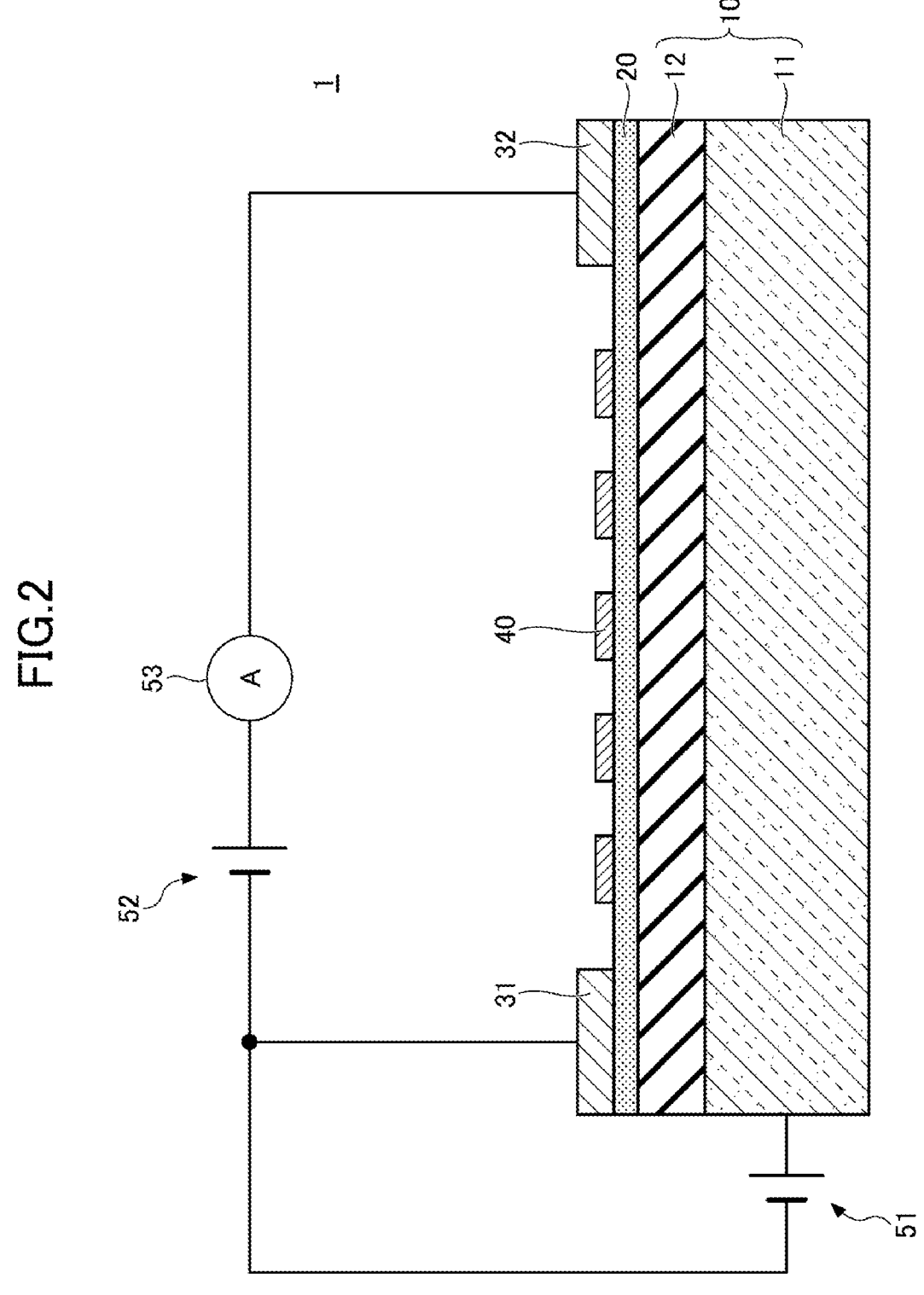
FIG. 2 is a cross sectional view illustrating the graphene optical sensor according to the embodiment in a mode of use.

One embodiment relates to an optical sensor using graphene, that is, a graphene optical sensor. FIG. 1 is a plan view illustrating the graphene optical sensor according to the embodiment. FIG. 2 is a cross sectional view illustrating the graphene optical sensor according to the embodiment in a mode of use.

As illustrated in FIG. 1 and FIG. 2, a graphene optical sensor 1 according to the embodiment includes a substrate 10, a graphene layer 20, a first electrode 31, a second electrode 32, and a plurality of plasmonic antennas 40.

The substrate 10 includes a conductive substrate 11, and an insulating layer 12 formed on the conductive substrate 11. For example, the conductive substrate 11 is a Si substrate, and the insulating layer 12 is a SiO$_2$ layer. The conductive substrate 11 is used as a gate electrode.

The graphene layer 20 is provided on the insulating layer 12. The graphene layer 20 includes one or a plurality of graphenes that are laminated. In a case where the graphene layer 20 includes a plurality of graphenes, the plurality of graphenes are preferably laminated at random (or rotated). This is because, by laminating the plurality of graphenes at random (or rotated), a relatively high carrier mobility can be obtained.

The first electrode 31 and the second electrode 32 are provided on a surface the graphene layer 20. The first electrode 31 and the second electrode 32 are electrically connected to the graphene layer 20. The first electrode 31 and the second electrode 32 are arranged in a first direction parallel to the surface of the graphene layer 20. A material used for the first electrode 31 and the second electrode 32 is not particularly limited, and for example, Au, Pd, Ni, Cr or Ti may be used. The first electrode 31 and the second electrode 32 may include a laminated structure made of such metals. For example, the first electrode 31 and the second electrode 32 may include a laminated structure made of a Ti film, and an Au film formed on the Ti film, or a laminated structure made of a Cr film, and an Au film formed on the Cr film. The materials used for the first electrode 31 and the second electrode 32 may be the same, or may be different.

The plurality of plasmonic antennas 40 are provided on the surface of the graphene layer 20 between the first electrode 31 and the second electrode 32. A material used for the plasmonic antennas 40 is not particularly limited. For example, the plasmonic antenna 40 may include a laminated structure made of a Pd film, and an Au film formed on the Pd film. For example, the Pd film has a thickness of approximately 10 nm, and the Au film has a thickness of approximately 30 nm.

The plasmonic antenna 40 includes a first rod portion 41, and a second rod portion 42. The first rod portion 41 extends in a second direction inclined by 45° from the first direction, and the second rod portion 42 extends in a third direction inclined by 45° from the first direction in a direction opposite the second direction with reference to the first direction. Accordingly, an angle formed between the second direction and the third direction is 90°. The first rod portion 41 and the second rod portion 42 intersect each other. The first rod portion 41 and the second rod portion 42 respectively have a rectangular planar shape having a length of approximately 0.14 μm in a longitudinal direction, a length of approximately 0.24 μm in a transverse (or short) direction perpendicular to the longitudinal direction, for example. The first rod portion 41 and the second rod portion 42 intersect each other at centers thereof along the respective longitudinal directions. The plasmonic antenna 40 has a planar shape that is an X-shape.

The plurality of plasmonic antennas 40 are arranged at a constant period in the second direction and the third direction. In the second direction, a plurality of first rod portions 41 are linearly arranged at a constant period. In the third direction, a plurality of second rod portions 42 are linearly arranged at a constant period. For example, the plurality of plasmonic antennas 40 are arranged at a period of 1.20 μm. In the second direction, a gap of approximately 60 μm is formed between two mutually adjacent first rod portions 41. In the third direction, a gap of approximately 60 μm is formed between two mutually adjacent second rod portions 42.

The graphene optical sensor 1 has the configuration described above.

When using the graphene optical sensor 1, a DC power supply 51 is connected between the conductive substrate 11 and the first electrode 31, as illustrated in FIG. 2. A positive terminal of the DC power supply 51 is connected to the conductive substrate 11, and a negative terminal of the DC power supply 51 is connected to the first electrode 31. In addition, a bias power supply 52 and an ammeter 53 are connected between the first electrode 31 and the second electrode 32. A positive terminal of the bias power supply 52 is connected to the ammeter 53, and a negative terminal of the bias power supply 52 is connected to the first electrode 31.

A gate voltage is applied to the conductive substrate 11 from the DC power supply 51, to adjust a potential of the graphene layer 20. A bias voltage is applied across the first electrode 31 and the second electrode 32 from the bias power supply 52, to detect an amount of current flowing through the ammeter 53. An amount of light incident to the graphene optical sensor 1 can be measured in this manner. For example, the gate voltage is 5 V, and the bias voltage is 0.6 V.

Next, functions of the plasmonic antenna 40 will be described. The first rod portion 41 extending in the second direction has an electric field in the second direction, and generates a plasmon resonance by coupling with light having a wavelength satisfying a resonance condition. In addition, the second rod portion 42 extending in the third direction has an electric field in the third direction, and generates a plasmon resonance by coupling with light having a wavelength satisfying the resonance condition. Light can be expressed as a combination of orthogonal linearly polarized lights. Accordingly, the plasmonic antenna 40 having the planar shape that is the X-shape can generate the plasmon resonance by coupling with light having an arbitrary polarization.

Figure 3:
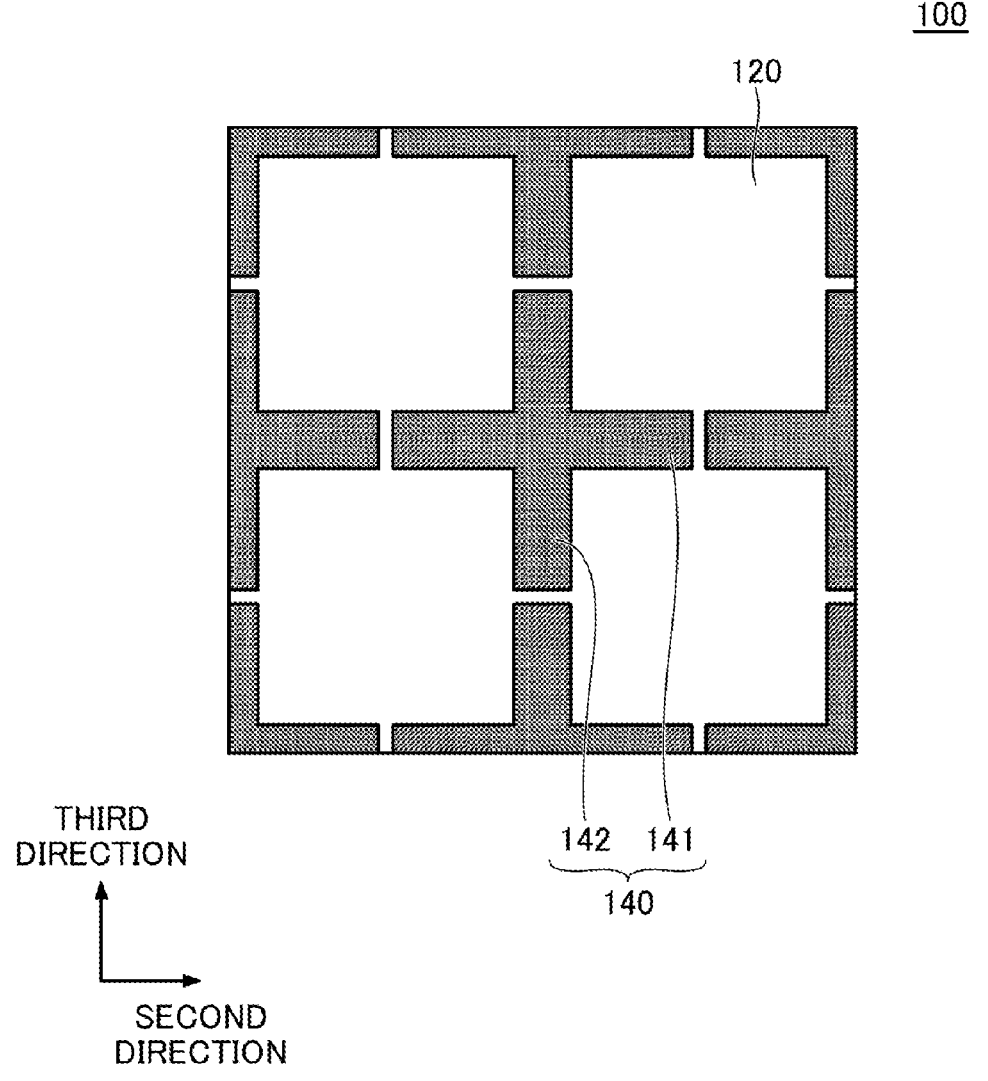
FIG. 3 is a diagram schematically illustrating a structure that is a target of a simulation.
Figure 4:
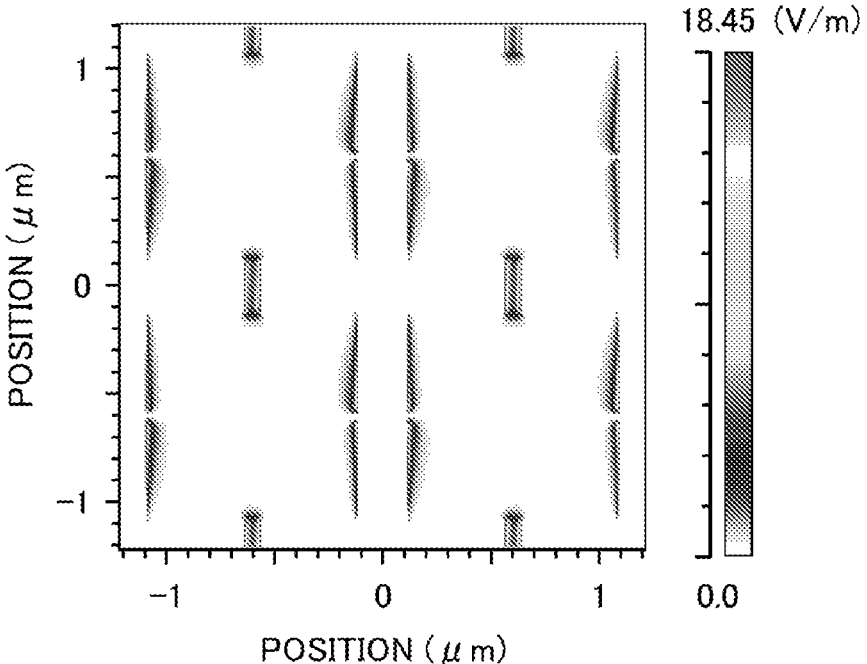
FIG. 4 is a diagram illustrating a simulation result for a case where an incident light has a polarization in a second direction.
Figure 5:
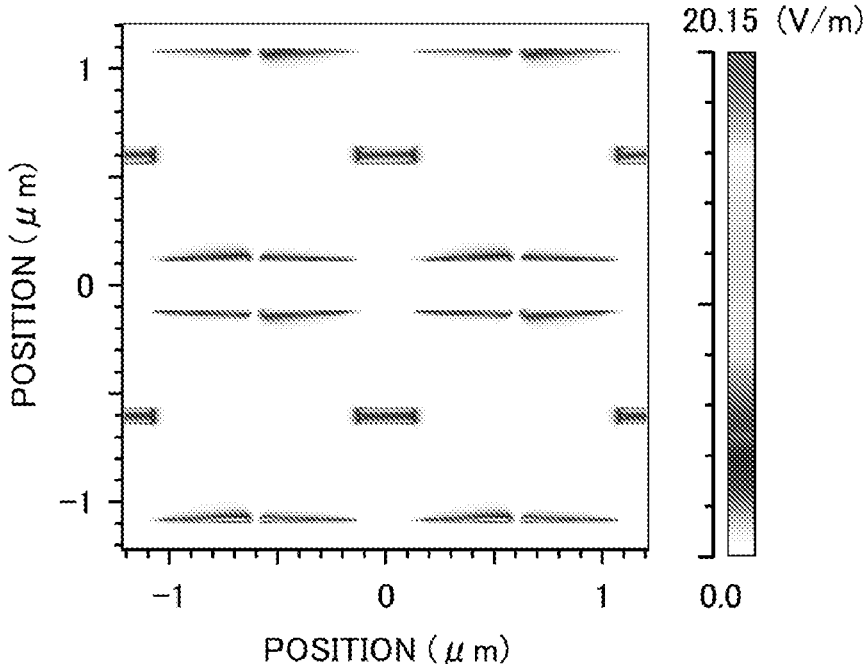
FIG. 5 is a diagram illustrating the simulation result for a case where the incident light has the polarization in a third direction.

Next, a simulation simulating the embodiment will be described. FIG. 3 is a diagram schematically illustrating a structure that is a target of the simulation. A structure 100 includes a graphene layer 120 corresponding to the graphene layer 20, and a plurality of plasmonic antennas 140 corresponding to the plurality of plasmonic antennas 40, respectively. The plasmonic antenna 140 includes a first rod portion 141 corresponding to the first rod portion 41, and a second rod portion 142 corresponding to the second rod portion 42. An electric field intensity distribution was computed for a case where the light having the polarization in the second direction is incident with respect to the structure 100 illustrated in FIG. 3, and a case where the light having the polarization in the third direction is incident with respect to the structure 100 illustrated in FIG. 3. Results of the simulations for the two cases are illustrated in FIG. 4 and FIG. 5, respectively. FIG. 4 is a diagram illustrating the simulation result for the case where the incident light has the polarization in the second direction, and FIG. 5 is a diagram illustrating the simulation result for the case where the incident light has the polarization in the second direction.

As illustrated in FIG. 4, in the case where the incident light has the polarization in the second direction, an electric field component is locally present in the gap between two adjacent first rod portions 141 that are mutually adjacent in the second direction. For this reason, a strong electric field region is formed in the gap, to thereby increase the light absorption efficiency of the graphene layer 120. In addition, as illustrated in FIG. 5, in the case where the incident light has the polarization in the third direction, the electric field component is locally present in the gap between two adjacent second rod portions 142 that are mutually adjacent in the third direction. For this reason, a strong electric field region is formed in the gap, to thereby increase the light absorption efficiency of the graphene layer 120. In both the case where the incident light has the polarization in the second direction and the case where the incident light has the polarization in the third direction, the light absorption efficiency of the graphene layer 120 can be increased. Further, in a case where the incident light has the polarization in a direction between the second direction and the third direction, an electric field region in accordance with the direction is formed in the gap between the two mutually adjacent first rod portions 141 and the gap between the two mutually adjacent second rod portions 142, and the light absorption efficiency of the graphene layer 120 can be increased.

Figure 6:
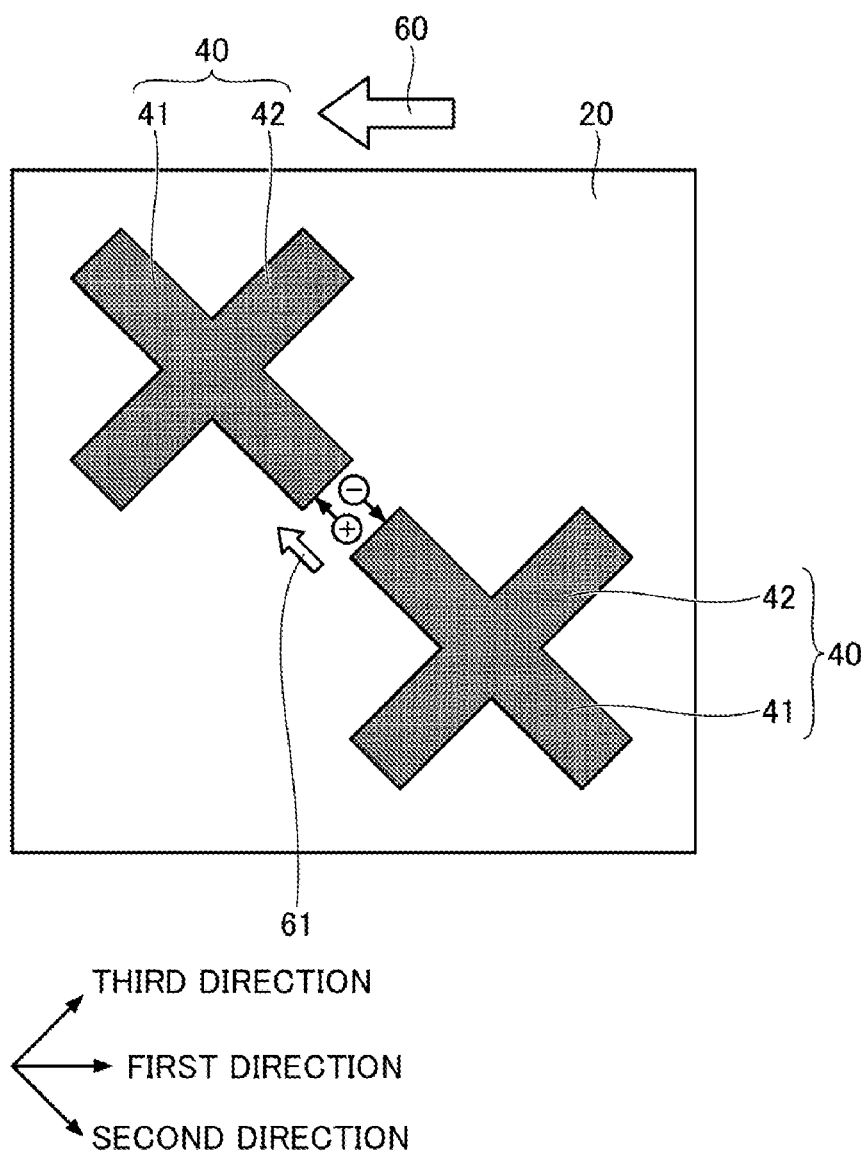
FIG. 6 is a diagram schematically illustrating behaviors of electrons and holes in the embodiment.

In this embodiment, because the plurality of plasmonic antennas 40 is arranged periodically in the second direction and in the third directions, the electrons and the holes generated in the graphene layer 20 can be moved to the first electrode 31 and the second electrode 32 while reducing deactivation caused by recombination. FIG. 6 is a diagram schematically illustrating behaviors of the electrons and the holes in the embodiment.

In a case where a bias electric field 60 is formed from the first electrode 31 toward the second electrode 32, a local electric field 61 associated with the bias electric field 60 is formed near the two adjacent first rod portions 41 that are mutually adjacent in the second direction, as illustrated in FIG. 6. This local electric field 61 is oriented in a direction parallel to the second direction. For this reason, the electrons generated in the graphene layer 20 between the adjacent first rod portions 41 that are mutually adjacent in the second direction are collected at the first rod portion 41 closer to the second electrode 32 (high potential side) by the local electric field 61, and the holes are collected at the first rod portion 41 closer to the first electrode 31 (low potential side) by the local electric field 61. The electrons collected at the first rod portion 41 reach the second electrode 32 via another plasmonic antenna 40 and the graphene layer 20 closer to the second electrode 32 (high potential side). The holes collected at the first rod portion 41 reaches the first electrode 31 via another plasmonic antenna 40 and the graphene layer 20 closer to the first electrode 31 (low potential side).

A local electric field associated with the bias electric field 60 is also formed near the two adjacent second rod portions 42 that are mutually adjacent in the second direction, although an illustration thereof will be omitted for the sake of convenience. This local electric field is oriented in a direction parallel to the third direction. For this reason, the electrons generated in the graphene layer 20 between two adjacent second rod portions 42 that are mutually adjacent in the third direction are collected at the second rod portion 42 closer to the second electrode 32 (high potential side) by the local electric field, and the holes are collected at the second rod portion 42 closer to the first electrode 31 (low potential side) by the local electric field. The electrons collected at the second rod portion 42 reach the second electrode 32 via another plasmonic antenna 40 and the graphene layer 20 closer to the second electrode 32 (high potential side). The holes collected at the second rod portion 42 reaches the first electrode 31 via another plasmonic antenna 40 and the graphene layer 20 closer to the first electrode 31 (low potential side).

In this embodiment, because the plurality of plasmonic antennas 40 is arranged periodically in the second direction and in the third direction, the electrons and the holes generated in the graphene layer 20 can be moved to the first electrode 31 and the second electrode 32 while reducing deactivation caused by recombination. Hence, according to this embodiment, it is possible to reduce the polarization dependence.

Figure 7:
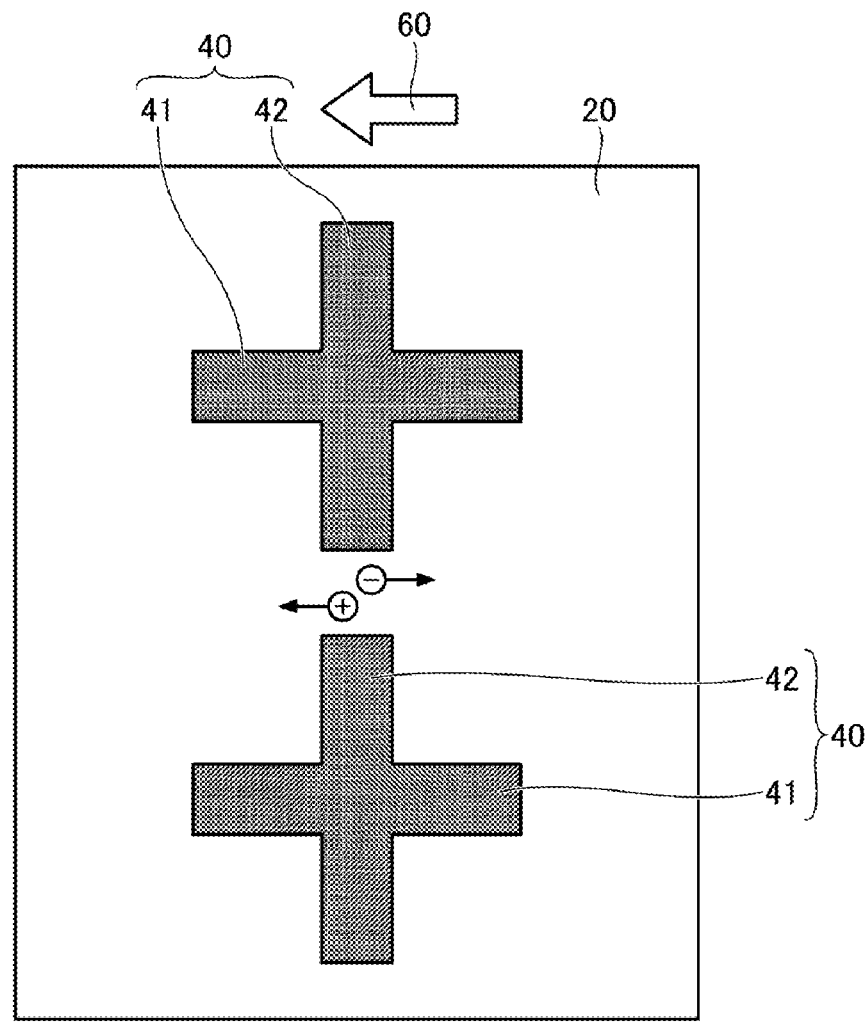
FIG. 7 is a diagram schematically illustrating the behaviors of the electrons and the holes in a reference example.
Figure 7:
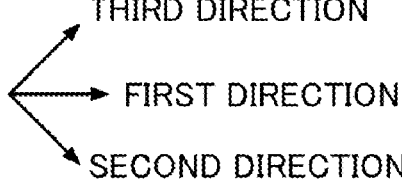

Even in a case where the direction in which the first rod portion 41 extends is the first direction, and the direction in which the second rod portion 42 extends is the direction is inclined by 90° from the first direction, it is possible to obtain the above described effect of increasing the light absorption efficiency of the graphene layer 120. In this case, however, recombination may easily occur even when the electrons and the holes are generated in the graphene layer 20, as in the following reference example. FIG. 7 is a diagram schematically illustrating the behaviors of the electrons and the holes in the reference example.

In the reference example illustrated in FIG. 7, even though a bias electric field 60 is formed from the first electrode 31 toward the second electrode 32, a local electric field is not formed near the two adjacent second rod portion 42 that are mutually adjacent in the direction perpendicular to the first direction. For this reason, even when the electrons and the holes are generated in the graphene layer 20 between the two adjacent second rod portions 42, the electrons and the holes are not collected at the second rod portion 42, and are deactivated due to recombination before reaching the first electrode 31 or the second electrode 32. In addition, even if the electrons and the holes were collected at the second rod portion 42, no photocurrent would be generated because there is no charge polarization. Accordingly, in the reference example illustrated in FIG. 7, although the effect of increasing the light absorption efficiency of the graphene layer 120 can be obtained, a photocurrent corresponding to the increased light absorption efficiency cannot be obtained, and it is difficult to reduce the polarization dependence.

The angle formed between the first direction and the second direction is not limited to 45°, and the angle formed between the first direction and the third direction is not limited to 45°. The angle formed between the first direction and the second direction is preferably in a range greater than or equal to 40° and less than or equal to 50°, more preferably in a range greater than or equal to 42° and less than or equal to 48°, and even more preferably 45°. The angle formed between the first direction and the third direction is preferably in a range greater than or equal to 40° and less than or equal to 50°, more preferably in a range greater than or equal to 42° and less than or equal to 48°, and even more preferably 45°.

In addition, the angle formed between the second direction and the third direction is not limited to 90°. The angle formed between the second direction and the third direction is preferably in a range greater than or equal to 80° and less than or equal to 90°, more preferably in a range greater than or equal to 85° and less than or equal to 90°, and even more preferably 90°.

A distance between two adjacent first rod portions that are mutually adjacent in the second direction is preferably in a range greater than or equal to 20 nm and less than or equal to 100 nm, more preferably in a range greater than or equal to 30 nm and less than or equal to 90, and even more preferably in a range greater than or equal to 40 nm and less than or equal to 80 nm.

Figure 8:
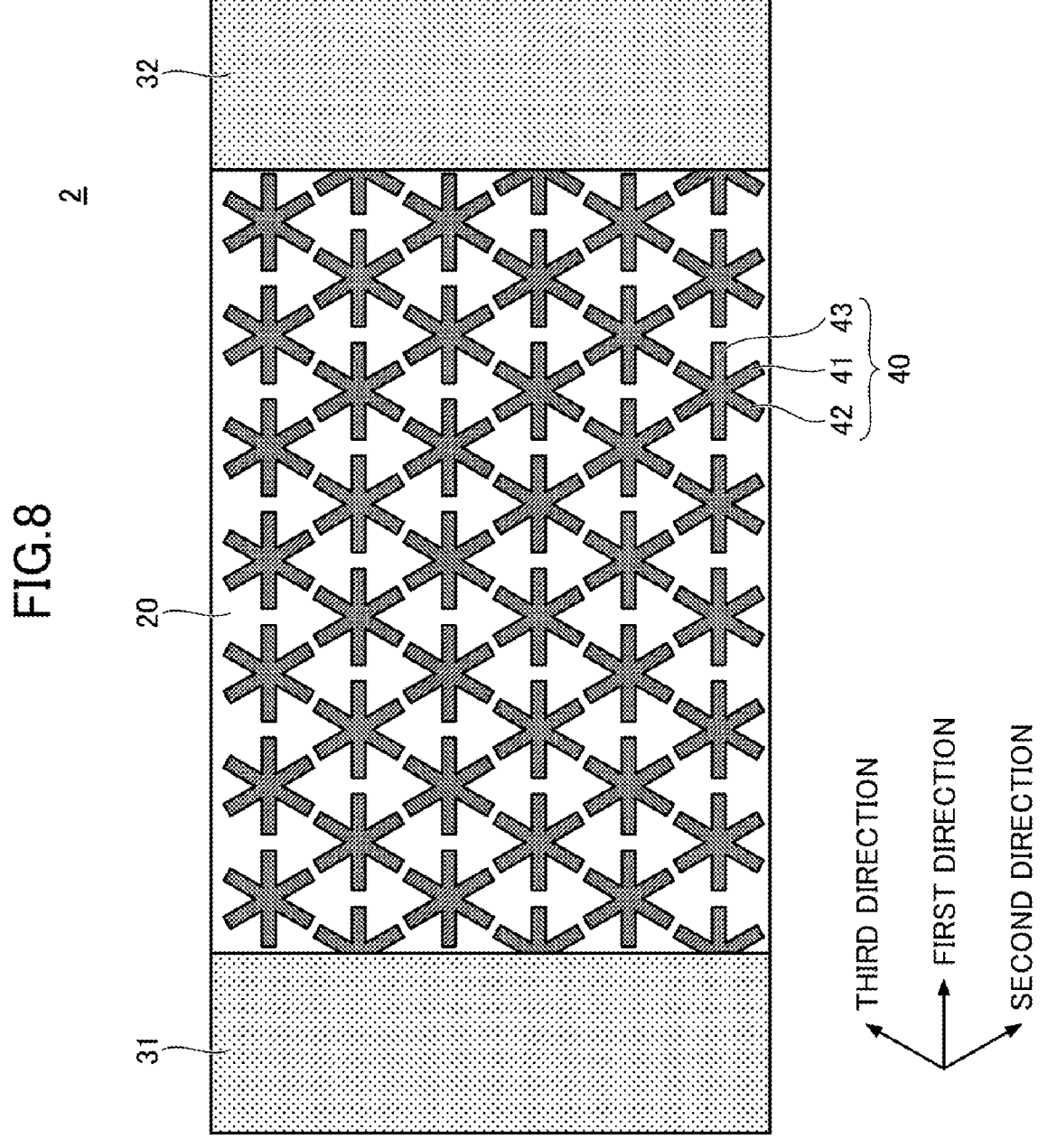
FIG. 8 is a plan view illustrating the graphene optical sensor according to a modification of the embodiment.

The planar shape of the plasmonic antenna is not limited to the X-shape. For example, the plasmonic antenna 40 may include a third rod portion 43 extending in the first direction, in addition to the first rod portion 41 and the second rod portion 42, as in a graphene optical sensor 2 according to a modification illustrated in FIG. 8. FIG. 8 is a plan view illustrating the graphene optical sensor according to the modification of the embodiment. In this modification, the second direction may be inclined by 60° from the first direction, and the third direction may be inclined by 60° from the first direction in a direction opposite the second direction with reference to the first direction, for example.

According to the present disclosure, it is possible to provide a graphene optical sensor capable of reducing the polarization dependence.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A graphene optical sensor comprising:
a graphene layer having a surface;
a first electrode and a second electrode, provided directly on the surface of the graphene layer, and space apart in a first direction parallel to the surface of the graphene layer; and
a plurality of plasmonic antennas provided directly on the surface of the graphene layer between the first and second electrodes,
wherein each plasmonic antenna of the plurality of plasmonic antennas, in a plan view, includes:
a first rod portion extending in a second direction inclined from the first direction, and
a second rod portion extending in a third direction inclined from the first direction in a direction opposite the second direction with reference to the first direction, and intersecting the first rod portion, and wherein:
the plurality of the plasmonic antennas is arranged periodically in the second direction and in the third direction, an angle formed between the first direction and the second direction is in a range greater than or equal to 40° and less than or equal to 50°, and
an angle formed between the first direction and the third direction is in a range greater than or equal to 40° and less than or equal to 50°.

2. The graphene optical sensor as claimed in claim 1, wherein
an angle formed between the first direction and the second direction is 45°, and
the angle formed between the first direction and the third direction is 45°.

3. The graphene optical sensor as claimed in claim 1, wherein an angle formed between the second direction and the third direction is in a range greater than or equal to 80° and less than or equal to 90°.

4. The graphene optical sensor as claimed in claim 1, wherein an angle formed between the second direction and the third direction is 90°.

5. The graphene optical sensor as claimed in claim 1, wherein each plasmonic antenna of the plurality of plasmonic antennas has a planar shape that is an X-shape.

6. The graphene optical sensor as claimed in claim 2, wherein each plasmonic antenna of the plurality of plasmonic antennas has a planar shape that is an X-shape.

7. The graphene optical sensor as claimed in claim 1, wherein
a distance between two adjacent first rod portions that are mutually adjacent in the second direction is in a range greater than or equal to 20 nm and less than or equal to 100 nm, and
a distance between two adjacent second rod portions that are mutually adjacent in the third direction is in a range greater than or equal to 20 nm and less than or equal to 100 nm.

8. The graphene optical sensor as claimed in claim 1, further comprising:
a conductive substrate;
an insulating layer provided on the conductive substrate, wherein the graphene layer is provided on the insulating layer.

9. The graphene optical sensor as claimed in claim 2, further comprising:
a conductive substrate;
an insulating layer provided on the conductive substrate, wherein the graphene layer is provided on the insulating layer.

10. The graphene optical sensor as claimed in claim 7, further comprising:
a conductive substrate;
an insulating layer provided on the conductive substrate, wherein the graphene layer is provided on the insulating layer.

* * * * *